United States Patent
Feng

(10) Patent No.: US 8,631,361 B2
(45) Date of Patent: Jan. 14, 2014

(54) INTEGRATED CIRCUIT DESIGN METHOD WITH DYNAMIC TARGET POINT

(75) Inventor: Jui-Hsuan Feng, Lotung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/482,737

(22) Filed: May 29, 2012

(65) Prior Publication Data

US 2013/0326434 A1 Dec. 5, 2013

(51) Int. Cl.
*G06F 17/50* (2006.01)

(52) U.S. Cl.
USPC .............................................. 716/53; 716/55

(58) Field of Classification Search
USPC ...................................... 716/50–55
See application file for complete search history.

(56) References Cited

U.S. PATENT DOCUMENTS

| 2002/0091986 | A1* | 7/2002 | Ferguson et al. | 716/19 |
| 2002/0188924 | A1* | 12/2002 | Pierrat et al. | 716/19 |

* cited by examiner

*Primary Examiner* — Binh Tat
(74) *Attorney, Agent, or Firm* — Haynes and Boone, LLP

(57) ABSTRACT

The present disclosure provides one embodiment of an integrated circuit (IC) method. The method includes receiving an IC design layout having a pattern, assigning target points to segments of the pattern, and producing first a simulated contour of the pattern based on the assigned target points. The method further includes reassigning the target points to the segments of the pattern based on the first simulated contour of the pattern; producing a second simulated contour of the pattern based on the reassigned target points, and after producing the second simulated contour of the pattern, producing a modified IC design layout.

19 Claims, 17 Drawing Sheets

INTEGRATED CIRCUIT DESIGN METHOD WITH DYNAMIC TARGET POINT

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of designing ICs and, for these advances to be realized, similar developments in IC design methods are needed.

For example, as the semiconductor industry has progressed into nanometer technology process nodes in pursuit of higher device density, higher performance, and lower costs, challenges from both fabrication and design have resulted in the development of various IC design methods that utilize optical proximity correction (OPC) and enforcement of mask rule check (MRC). During the IC design, the design pattern is adjusted to meet the specification of mask-making and the mask manufacturing capability which is determined by the MRC. However, the enforcement of MRC leads to erosion and reduction of the OPC simulated contour hitting the target. Accordingly, although existing IC design methods have been generally adequate for their intended purpose, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
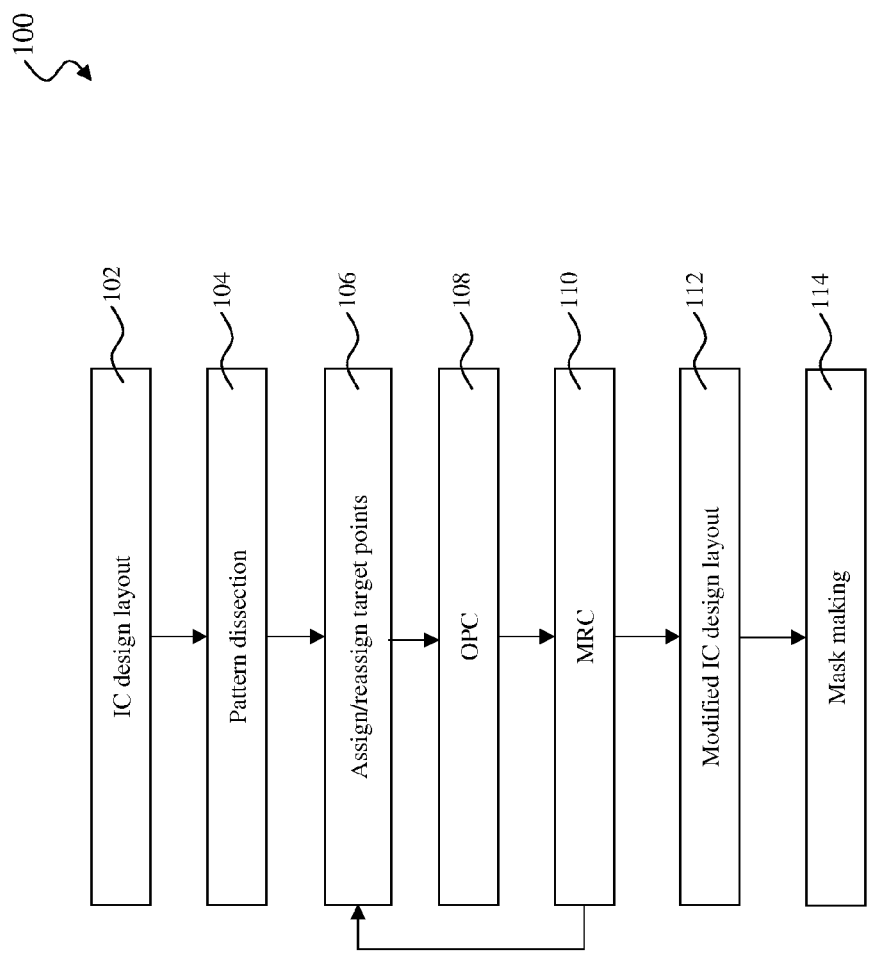
FIG. 1 is a flowchart of an embodiment of an integrated circuit (IC) method according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

FIG. 1 illustrates a flowchart of a method 100 for integrated circuit (IC) designing and mask making constructed according to various aspects of the present disclosure in one or more embodiments. The method 100 begins at step 102 by providing or receiving an IC design layout (or IC design pattern) from a designer. In one example, the designer can be a design house. In another example, the designer is a design team separated from a semiconductor manufacturer assigned for making IC products according to the IC design layout. In various embodiments, the semiconductor manufacturer is capable for making photomasks, semiconductor wafers, or both. The IC design layout includes various geometrical patterns designed for an IC product and based on the specification of the IC product. The method 100 may proceed to step 104 by performing a pattern dissection to the IC design layout. The pattern dissection includes dissecting edges of a pattern of the IC design layout into a plurality of segments. The method continues to step 106 where targets and target points are assigned or reassigned dynamically to a pattern of the IC design layout. The method continues to step 108 where OPC takes place on the IC design layout. The method continues to step 110 where MRC takes place on the design layout. Depending on a predetermined number of reassignment iterations and OPC and MRC outcome, steps 106 to 110 may be repeated as necessary. The method 100 continues to step 112 where a modified IC design layout is produced. The method continues to step 114 where the mask is made in accordance with the modified IC design layout. The discussion that follows illustrates various embodiments of patterns of an IC design layout at various stages of the method 100 of FIG. 1.

The IC design layout may be presented in one or more data files having the information of the geometrical patterns. In one example, the IC design layout is expressed in a "gds" format. The designer, based on the specification of the product to be manufactured, implements a proper design procedure to carry out the IC design layout. The design procedure may include logic design, physical design, and/or place and route. As an example, a portion of the IC design layout includes various IC features (also referred to as patterns), such as active region, gate electrode, source and drain, metal lines or via of the interlayer interconnection, and openings for bonding pads, to be formed in a semiconductor substrate (such as a silicon wafer) and various material layers disposed over the semiconductor substrate. The IC design layout may include certain assist features, such as those features for imaging effect, processing enhancement, and/or mask identification information.

Figure 2:
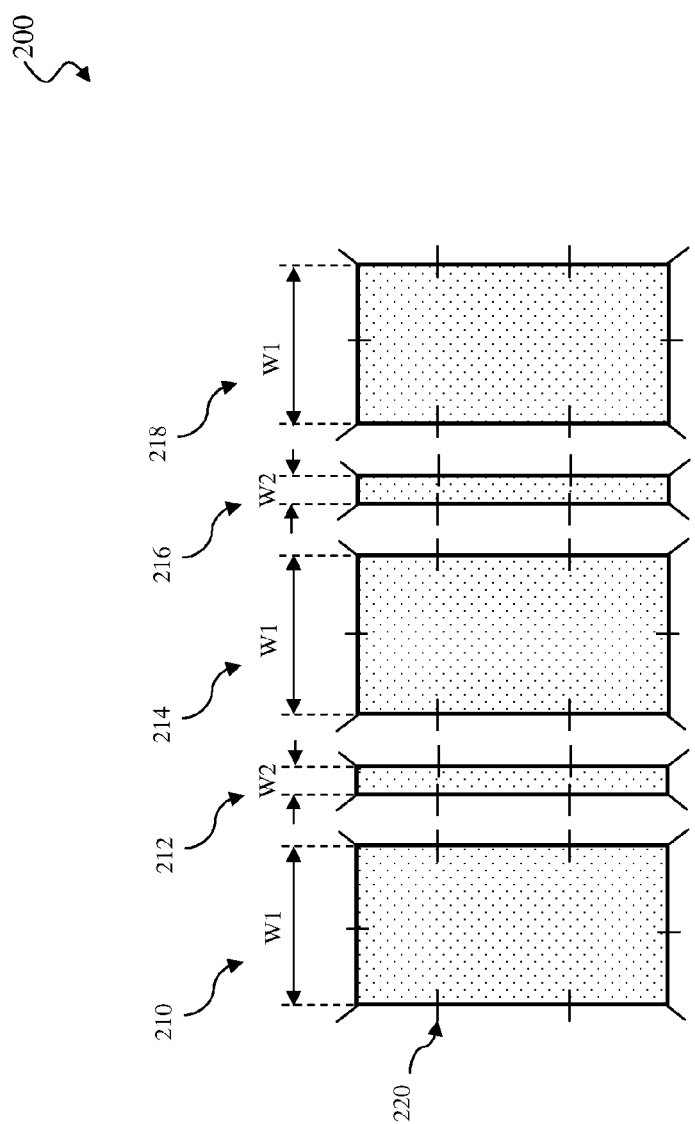
FIGS. 2-17 illustrate schematic views of patterns of an IC design layout at various stages of the method of FIG. 1, according to various aspects of the present disclosure.

FIG. 2 illustrates an IC design layout 200 having a plurality of exemplary patterns 210, 212, 214, 216, and 218 for illustration. In the present embodiment, the patterns 210, 212, 214, 216, and 218 are polygons defining features to be formed on a semiconductor substrate. The patterns 210, 214, and 218 include larger dimensions (e.g., width W1) then the dimensions (e.g., width W2) of the patterns 212 and 216.

In one embodiment, pattern dissection is applied to the pattern 210 to generate multiple segments defined by dissection points (or stitching points) 220. A portion of the edges of pattern 210 between two adjacent dissection points defines a segment. In the present embodiment, ten dissection points 220 are generated to the pattern 210 by the pattern dissection, defining ten segments of the edges of the pattern 210. In this particular example, each side edge of the pattern 210 includes at least two segments. In another embodiment, the pattern dissection is similarly applied to the patterns 212, 214, 216, and 218 as illustrated in FIG. 2. In such embodiments, where dissection is applied to patterns having narrower side edges, the pattern dissection may not define a dissection point along such side edge, (see patterns 212 and 216 not being dissected on the top and bottom narrow side edges). In such examples, side edges of the patterns 212 and 216 may include only one segment.

It is understood that the above examples, illustrated in FIG. 2 of pattern dissection are intended to be illustrative and are not limiting, unless expressly claimed. Further, the pattern dissection may be applied to patterns according to design rules and mask rules. For example, a pattern in the IC design layout 200 can be dissected differently, depending on the geometry and dimensions of the corresponding pattern. In another example, a pattern may be dissected into a plurality of segments with different dimensions in one direction. In an additional example, when a pattern is asymmetric, the number of segments and the dimensions of the segments generated from the pattern by the dissection can be different between a first direction and a second direction. The various design rules and mask rules can be extracted from the semiconductor manufacturer and/or mask manufacturer in consideration of the semiconductor and mask manufacturing capability. IC design follows the design and mask rules in order to generate producible circuit patterns.

Figure 3:
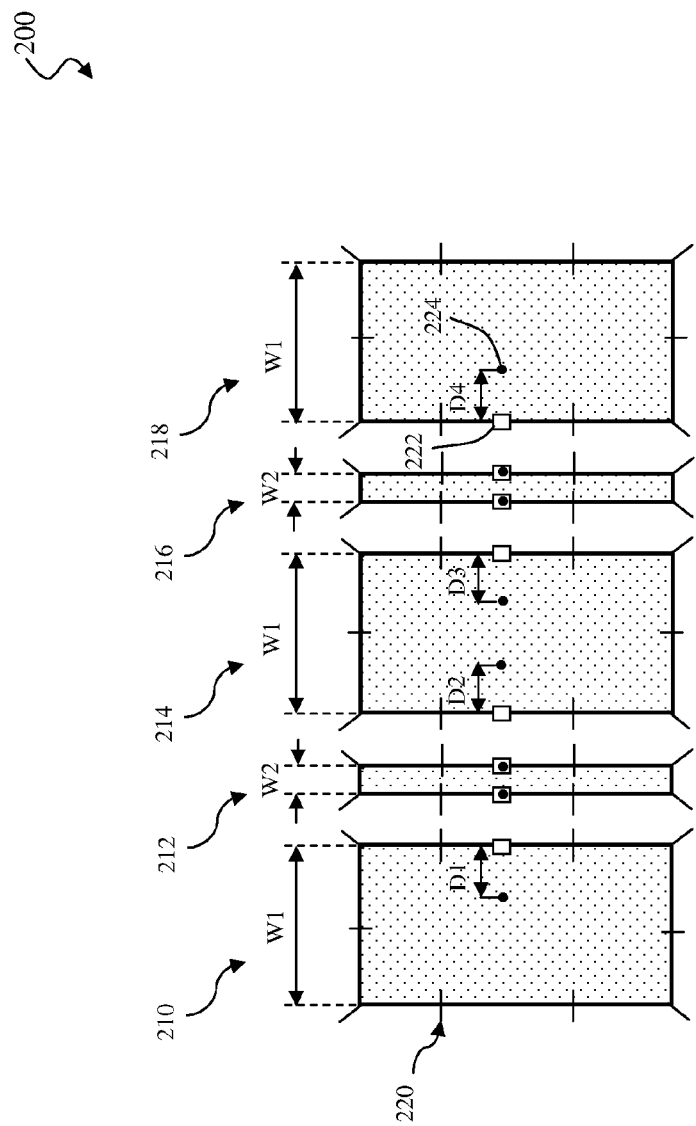

With reference to FIG. 3, one or more targets 222 are assigned to the patterns 210, 212, 214, 216, and 218 after the pattern dissection. Further, one or more target points 224 are assigned to the patterns 210, 212, 214, 216, and 218. Because in the present embodiment patterns 212 and 216 have a dimension W2 that is relatively narrow, the critical dimension (CD) of these patterns have tight tolerances to edge placement error (EPE). As such, the target points 224 of patterns 212 and 216 are fixed (i.e., not dynamically reassigned) and assigned directly on the targets 222. Because in the present embodiment the patterns 210, 214, and 218 have a dimension W1 that is relatively wide, the CD of these patterns have looser tolerances to EPE when compared to the tolerances of the patterns 212 and 216. As such, the target points 224 of patterns 210, 214, and 218 are presently assigned at an initial distance (D1, D2, D3, and D4) away from the targets 222. The target points 224 of patterns 210, 214, and 218 will be dynamically reassigned (or moved) during the IC design process, depending on simulation outcome from OPC and MRC, as will be further described below. It is understood that for simplification only certain exemplary targets 222 and target points 224 are illustrated and that the other segments of the patterns 210, 212, 214, 216, and 218 may include additional targets and target points, depending on design requirements. The targets and target points represent spatial locations relative to the patterns. For example, the targets 222 and target points 224 are spatially defined in the pattern 210 of the IC design layout 200. The various targets and target points are assigned to the patterns for simulation verification or other design purposes as discussed below.

Figure 4:
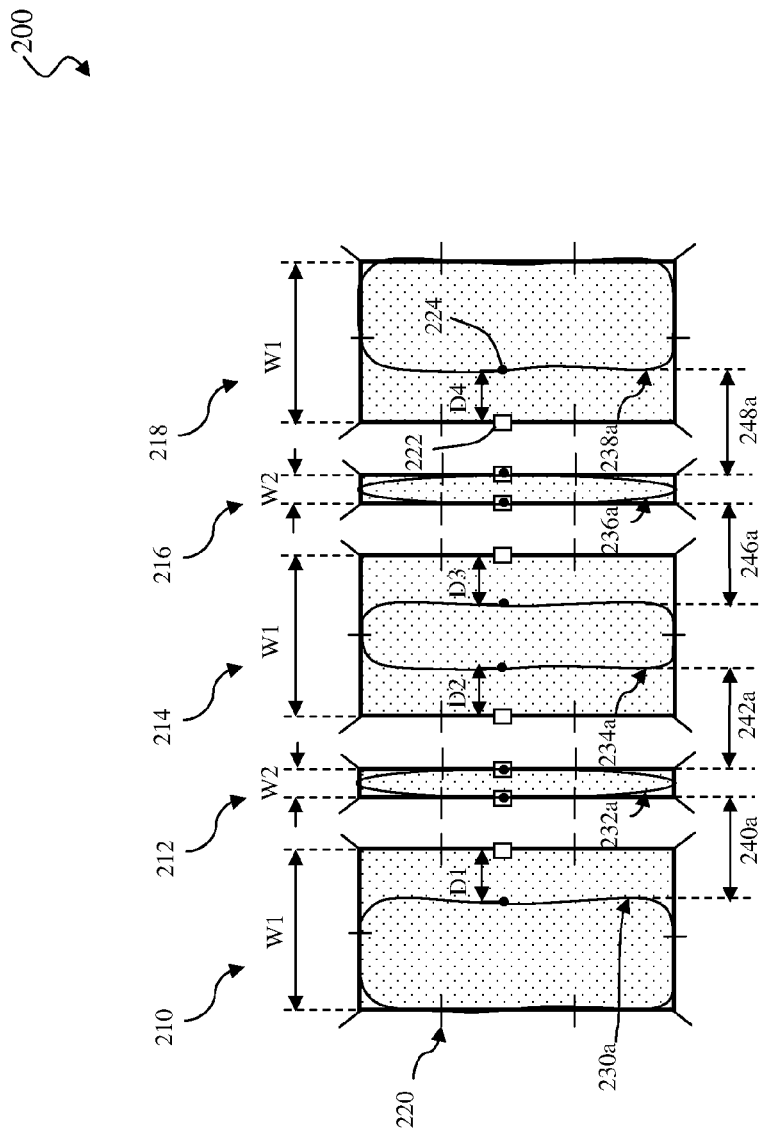

Referring to FIG. 4, optical proximity correction (OPC) simulation is performed to generate contours. When a simulated contour 230a of the corresponding pattern 210 is generated during optical proximity correction (OPC), the defined target points 224 of the corresponding pattern 210 are checked to verify if the target 224 is within or overlapped with the simulated contour 230a of the corresponding pattern 210. The OPC is performed to correct the image errors by modifying the IC design layout 200. The OPC may include moving edges of a pattern and adding assist features to the pattern. In one embodiment, the pattern is resized, repositioned, and/or reshaped. In another embodiment, various assist features, such as scattering bars, serifs or hammerheads are added to the pattern. The assist features may be placed a distance away from the pattern (such as scattering bars) or be placed adjacent to the pattern (such as serifs and hammerheads). In one embodiment of the OPC implementation, segments of a pattern are moved outward from the pattern. Additionally, other features may be added or other action may be applied to the IC design layout 200. For example, dummy insertion features may be added to the IC design layout 200 for enhanced chemical mechanical polishing (CMP) or other processing advantages.

Similarly, the targets 222 and target points 224 are spatially defined in the patterns 212, 214, 216, and 218 of the IC design layout 200. When simulated contours 232a, 234a, 236a, and 238a of the corresponding patterns 212, 214, 216, and 218 are generated during OPC, the target points 222 defined in the corresponding pattern 212, 214, 216, and 218 are checked to verify if the target points 224 are within or overlapped with the simulated contours 232a, 234a, 236a, and 238a of the corresponding patterns 212, 214, 216, and 218. In the present example, one dynamic target point 222 is defined on an inner side of the pattern 210, two fixed target points 222 are defined on both inner sides of the pattern 212, two dynamic target points 224 are defined on the two inner sides of the pattern 214, two fixed target points 222 are defined on both inner sides of the pattern 216, and one dynamic target point 222 is defined on an inner side of the pattern 218.

After performing OPC, a mask rule check (MRC) to the IC design layout 200 is performed. During MRC, the IC design layout 200 is checked by one or more mask rules and is modified accordingly. In one embodiment, various mask rules are extracted from the mask fabrication. Various mask making data are collected from the mask fabrication and extracted into a set of rules that the IC design layout, as the pattern to be imaged to a mask, should follow. In one embodiment, the MRC is implemented to the IC design layout 200 through the various sections of the patterns. The sections that fail one or more mask rules are modified according to the corresponding mask rules.

An example of the MRC is described with reference to FIG. 4 for illustration. In a particular example, one of the mask rules, among others, is that the distance between the adjacent patterns is equal to or greater than a minimum distance (Dmin). The distance 240a between the inner right portion of contour 230a of the pattern 210 and the inner left portion of the contour 232a of the pattern 212 is illustrated in FIG. 4. If the distance 240a is less than Dmin, the contour of the inner right portion of the pattern 210 is modified such that the violated mask rule is satisfied after the modification. The modification includes moving the relevant segment(s) contour to increase the corresponding distance. Similarly, MRC is applied with respect to distance 242a, 246a, and 248a between the contours of patterns 212, 214, 216, and 218. In the illustrated embodiment of FIG. 4, the distances 240a, 242a, 246a and 248a are greater than Dmin and no modification is necessary to satisfy MRC rule.

After performing MRC, the target points are reassigned, OPC is repeated, and MRC is repeated to the IC design layout for a predetermined number of iterations or until the target points converge and OPC and MRC are fulfilled. The target points may converge, for example, when either the target points reach their respective target or when it is determined that moving the target points toward their respective targets will not have a positive effect on the contour of the respective pattern. For example, moving the target points toward their respective targets will not have a positive effect if the MRC rule will be violated and the MRC will modify the contour back to some other position.

Figure 5:
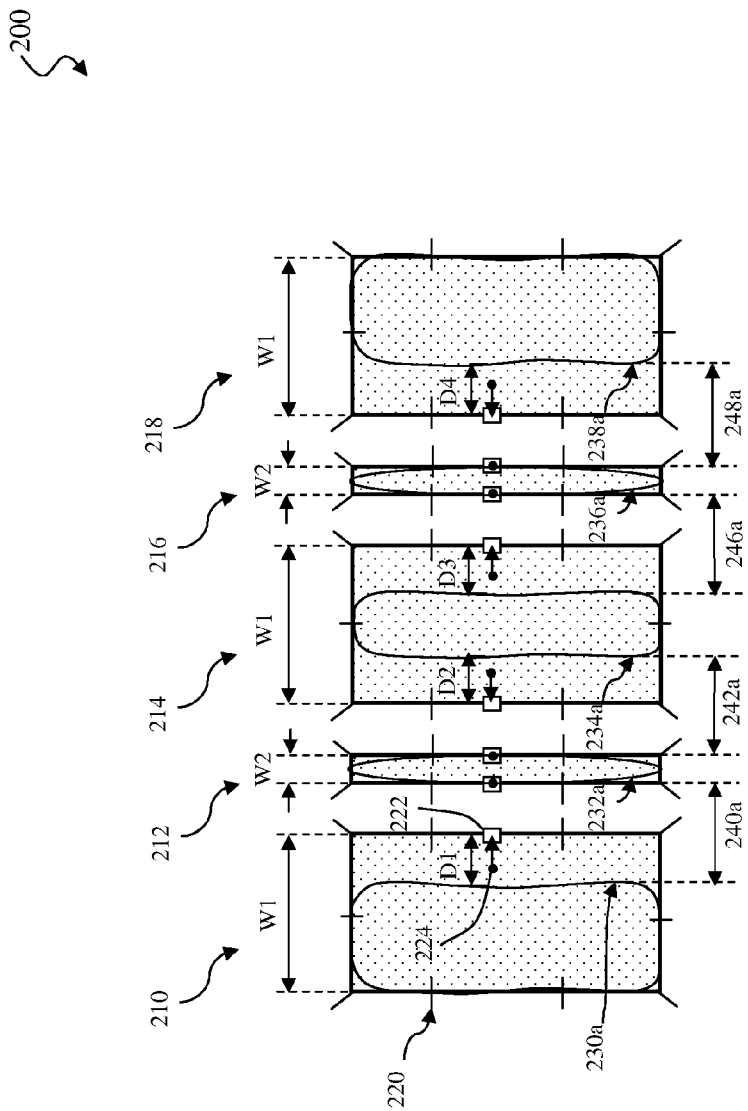

As an example, with reference to FIG. 5, the target points 224 of patterns 210, 214, and 218 that have not reached their respective targets 222 are reassigned (or moved). Reassigning may include a rule based approach or a model based approach. The rule based approach provides for a fixed step size for each reassigning iteration. In the rule based approach, the number of reassigning iterations (e.g., N) and the initial distance (e.g., D) from the target point to the target is initially defined. After defining the initial distance D and the number of reassigning iterations N, the fixed step size for each reassigning iteration is defined by D/N.

As an example, with reference to pattern 210 in FIG. 4, according to the rule based approach, reassigning of the target point 224 is performed by defining the initial distance (e.g., D1) and the number of reassigning iterations (e.g., N). The fixed step size for each reassigning iteration is then defined by D1/N. According to this rule, the target point 224 of the pattern 210 is moved toward its respective target 222 at a fixed step of D1/N. Similarly, in the rule based approach, the target points 224 of the patterns 214 and 218 are moved toward their respective targets 222 at a fixed step size defined by D2/N, D3/N, and D4/N, respectively. Because the targets points 224 of the patterns 212 and 216 are already on their respective target 222, no reassigning of target points takes place for the target points of these patterns.

The model based approach provides for a variable step size for each reassigning iteration. In the model based approach, the number of reassigning iterations (e.g., N) is defined. The edge placement error ($EPE_i$) is determined for the current iteration by measuring the distance from a contour edge to the target of the pattern. The variable step size for the current reassigning iteration is defined by $EPE_i*(N-i)/N$, where i is the current iteration, $EPE_i$ is the edge placement error of the current iteration, and N is the defined number of iterations.

As an example, with reference to pattern 210 in FIG. 4, assume that the number of reassigning iterations N is predefined as 3. $EPE_i$ is determined by measuring the distance from the edge of the contour 230*a* to the target 222 of pattern 210. In this case, because the first OPC simulated contour 230*a* directly on the target point 224, $EPE_1$ is the same as D1. The step size of the current iteration that the target point 224 moves toward target 222 is $EPE_1*(3-1)/3$ (or D1*2/3). As understood, in the model based approach, the step size varies for each reassigning iteration, and the up-front reassigning iterations have the greater step size. Similarly, in the model based approach, the target points 224 of the patterns 214 and 218 are moved toward their respective target 222 at a fixed step size defined by $EPE_i*(N-i)/N$. Because the targets points 224 of the patterns 212 and 216 are already on their respective target 222, no reassigning of target points takes place for the target points of these patterns.

Still referring to FIG. 5, the present embodiment will proceed with a rule based approach to illustrate various aspects of the present disclosure. With reference to pattern 210, applying the rule based approach to reassigning of the target point 224 results in a fixed step size for each iteration of D1/N; and assuming that N has been defined as 3, the fixed step size is D1/3. As illustrated, the target point 224 of pattern 210 has moved from an inner portion of the pattern 210 outward and toward target 222 (illustrated by an arrow) by a fixed step size of D1/3. Similarly, in the rule based approach, the target points 224 of the patterns 214 and 218 are moved toward their respective targets 222 (illustrated by arrows) at a fixed step size defined by D2/3, D3/3, and D4/3, respectively.

Figure 6:
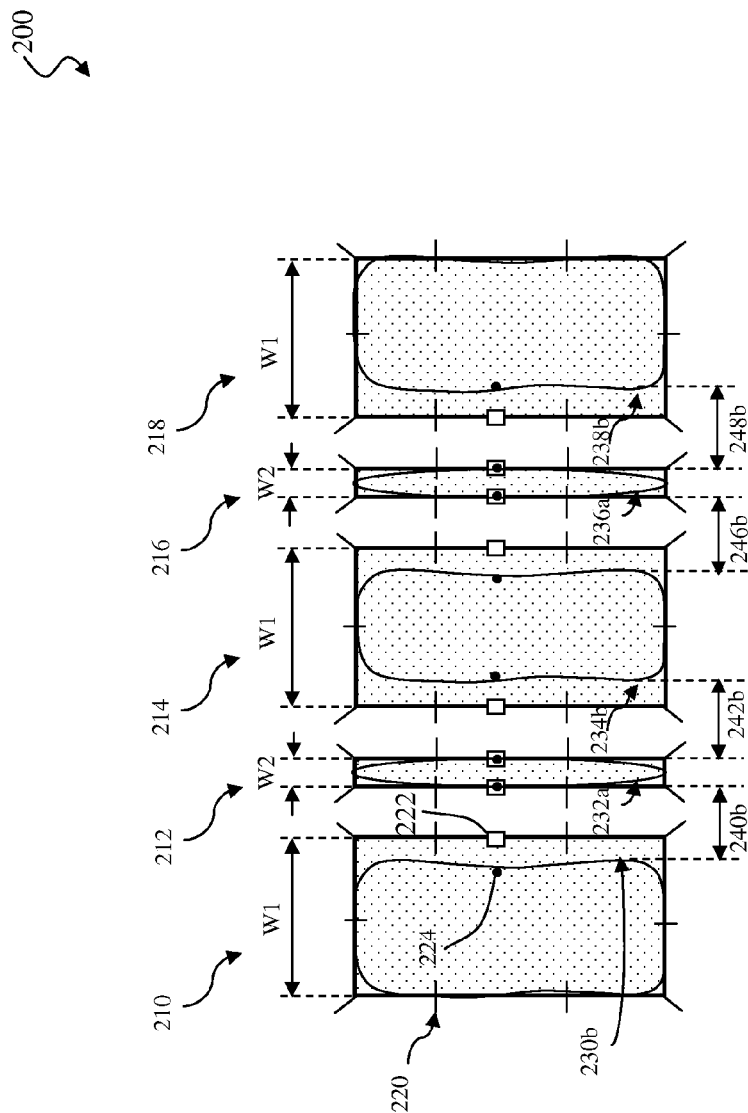

Referring to FIG. 6, after reassignment of the target points 224 of patterns 210, 214 and 216, OPC simulation is performed to provide an updated contour 230*b*, 234*b*, and 238*b*, for each of the patterns 210, 214, and 218. For various reasons, the OPC simulation that generates the updated contours 230*b*, 234*b*, and 238*b*, may not generate contours that land directly on the target points of the respective patterns. After performing OPC, the IC design layout 200 is checked for violation of MRC rules. In the illustrated embodiment of FIG. 6, the updated distances 240*b*, 242*b*, 246*b*, and 248*b* are greater than Dmin and no modification is necessary to satisfy MRC rule.

Figure 7:
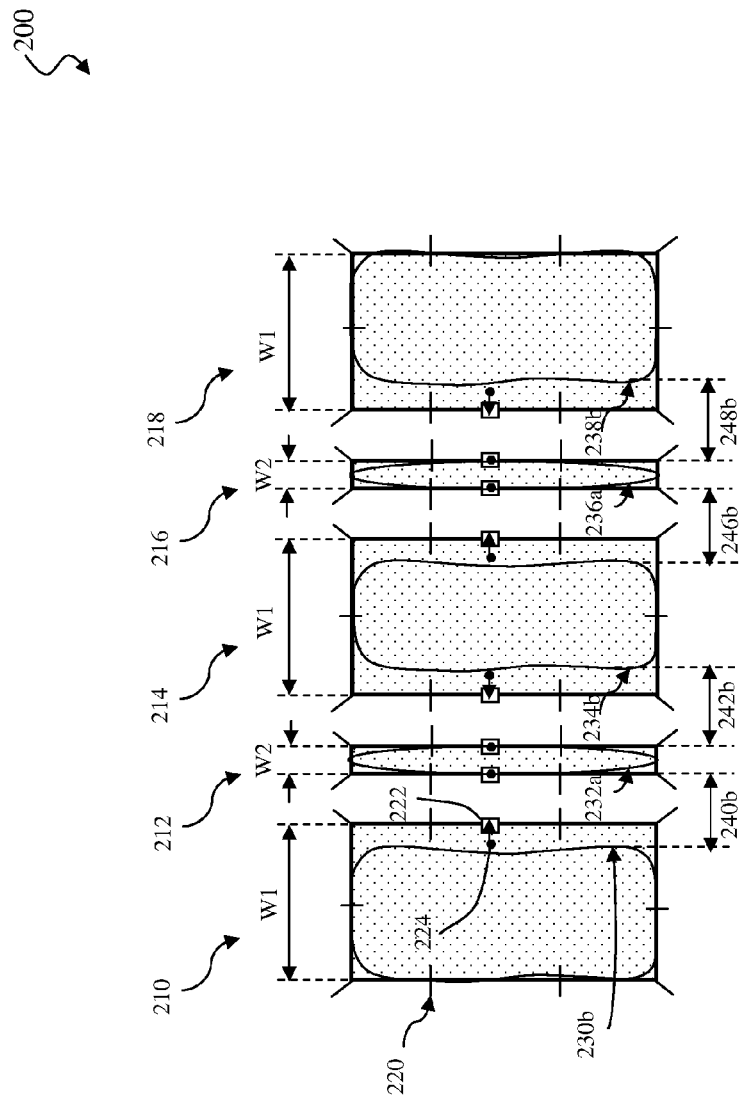

Referring to FIG. 7, after completing the first reassignment iteration by dynamically reassigning the target points, performing OPC, and MRC, the steps are repeated to the IC design layout in a second reassignment iteration. The second reassignment iteration is performed by moving the target points 224 at a fixed step size of D1/3, D2/3, D3/3, and D4/3 toward the respective target 222 (illustrated by arrows) of the patterns 210, 214, and 218.

Figure 8:
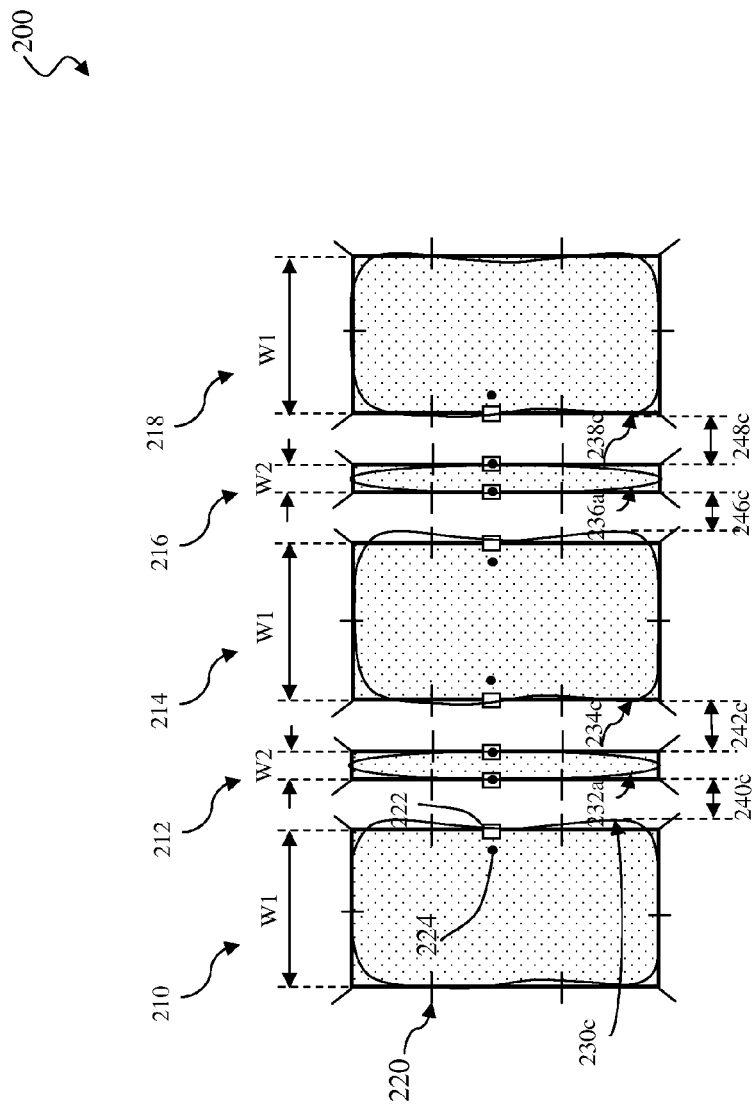

Referring to FIG. 8, after the second reassignment iteration which dynamically reassigns the target points 224 of patterns 210, 214 and 216, OPC simulation is performed to provide an updated contour 230*c*, 234*c*, and 238*c*, for each of the patterns 210, 214, and 218. After performing OPC, the IC design layout 200 is checked for violation of MRC rules. In the illustrated embodiment of FIG. 8, the updated distances 240*c*, 242*c*, 246*c*, and 248*c* are less than Dmin and therefore violate the MRC rule. As such, modification of the contours is performed to satisfy MRC rule.

Figure 9:
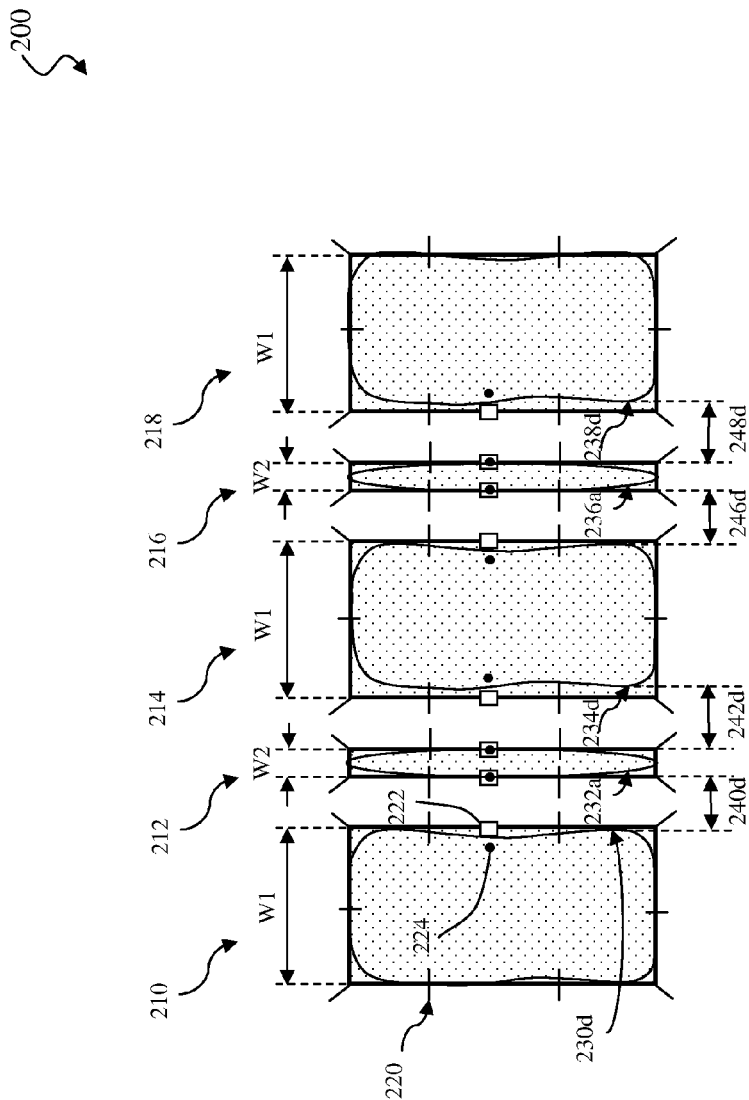

Referring to FIG. 9, MRC modifies the contour 230*c*, 234*c*, and 238*c* of patterns 210, 214, and 218 to satisfy the MRC rule. The modification includes moving the relevant contours 230*c*, 234*c*, and 238*c* to increase the corresponding distance between patterns. After MRC generated modified the contour 230*d*, 234*d*, and 238*d* of patterns 210, 214, and 218, the updated distances 240*d*, 242*d*, 246*d*, and 248*d* are greater than Dmin and satisfy MRC rule.

Figure 10:
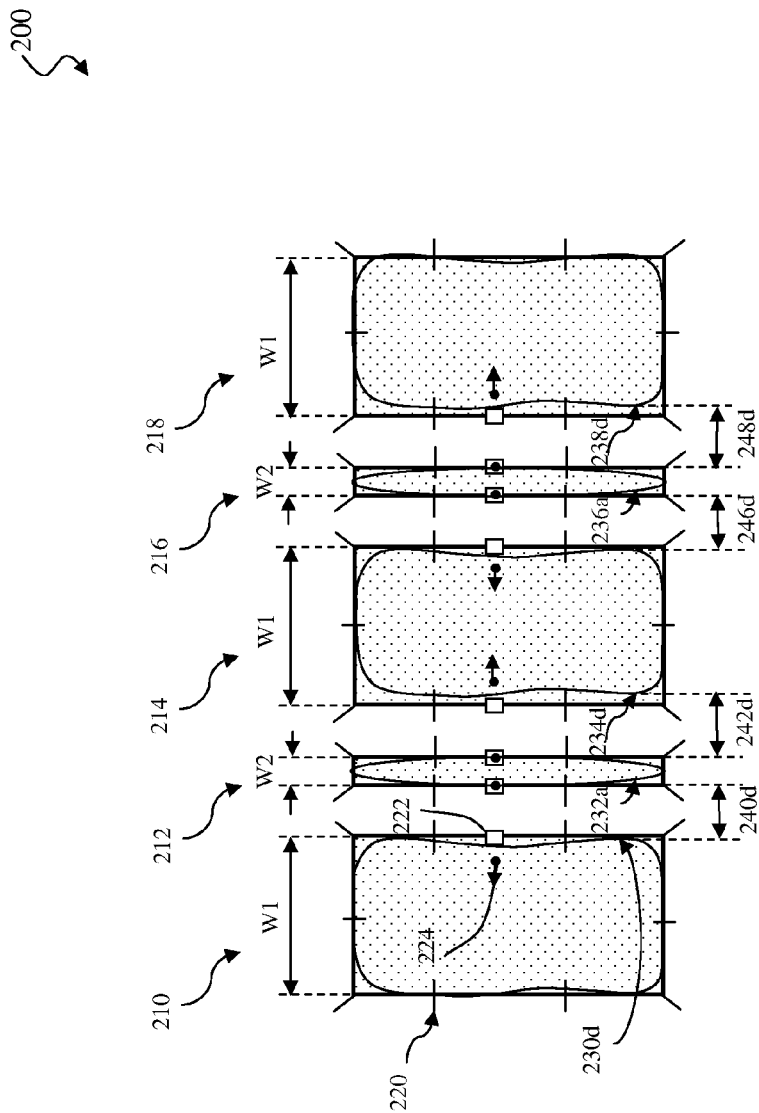

Referring to FIG. 10, after completing the second reassignment iteration by dynamically reassigning the target points, performing OPC, and MRC, the steps are repeated to the IC design layout in a third reassignment iteration. During the third reassignment iteration, the reassignment iteration recognizes that the MRC rule has been applied and the contour has been modified by MRC. Because of this recognition, reassignment will backtrack a fraction of the step size of the prior iteration. In other words, the reassignment will move the target point away from the target (indicated by arrows) by a fraction of the prior iteration step size. In the present embodiment, for example, the backtrack step size is a fraction of the fixed step size of D/N. For example, the backtrack step size may be ½ of the fixed step size (i.e., ½×D/N). It is understood that the fraction may be any appropriate fraction based on design requirements.

Figure 11:
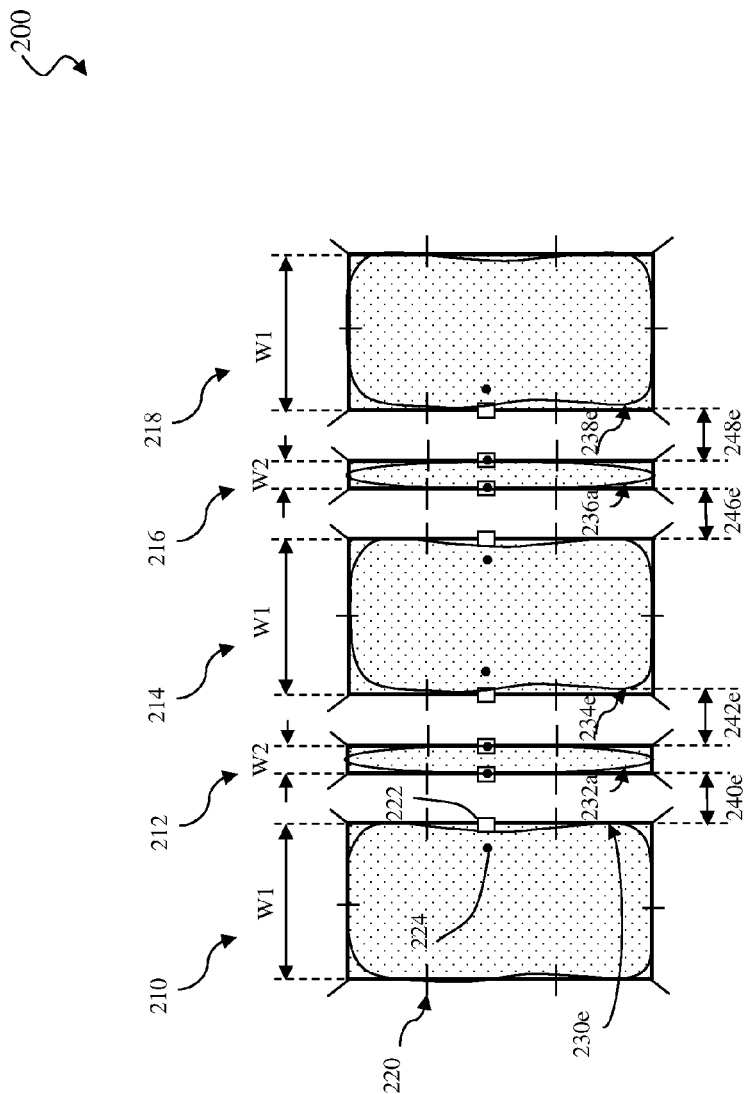

Referring to FIG. 11, after the third reassignment iteration of the target points 224 of patterns 210, 214 and 216, OPC simulation is performed to provide an updated contour 230*e*, 234*e*, and 238*e*, for each of the patterns 210, 214, and 218. After performing OPC, the IC design layout 200 is checked for violation of MRC rules. In the illustrated embodiment of FIG. 11, the updated distances 240*e*, 242*e*, 246*e*, and 248*e* are greater than Dmin and no modification is necessary to satisfy MRC rule.

Accordingly, the rule and model based approaches to dynamic reassignment of target points allow for fine tuning contours within the IC design layout 200 such that MRC violation can be avoided. It is understood that reassignment of target points can be performed in any number of iterations and that the more iterations the better tuned the patterns of the IC design layout 200 will be.

Figure 12:
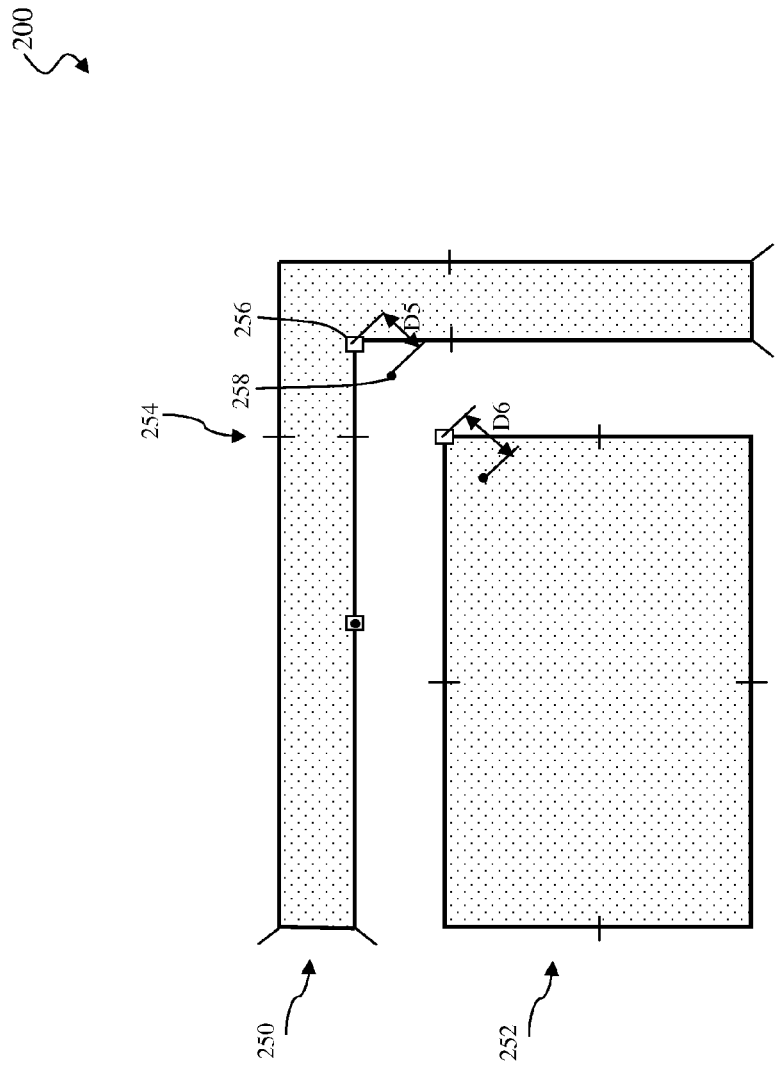

Referring to FIG. 12 illustrated is a further embodiment of the IC design layout 200 that includes a plurality of exemplary patterns 250 and 252 for illustration. The patterns 250 and 252 are patterns defining features to be formed on a semiconductor substrate. The patterns 250 and 252 are positioned with a certain spatial configuration relative to each other. For example, in the present embodiment, the pattern 250 partially circumscribes the pattern 252. The pattern 250 includes an inner corner (or vertex) facing the pattern 252 and an outer corner (or vertex). The pattern 252 includes an outer corner (or vertex) that faces pattern 250.

In one embodiment, pattern dissection is applied to the pattern 250 to generate multiple segments defined by dissection point (or stitching points) 254 located along an edge of the pattern 250 and along select corners. A portion of the edges of pattern 250 between two adjacent dissection points defines a segment. In the present embodiment, the dissection point 254 generated to the pattern 250 by the pattern dissection, defines eight segments of the edges of the pattern 250. In this particular example, one segment is a inner corner segment of the pattern 250. In a further embodiment, the pattern dissection is similarly applied to the pattern 252. In such embodiments, pattern dissection is applied to define dissection points located along one or more side edges of the pattern 252 to define four segments of the pattern 252.

It is understood that the above examples, illustrated in FIG. 12 of pattern dissection are intended to be illustrative and are not limiting, unless expressly claimed. Further, the pattern dissection may be applied to patterns according to design rules and mask rules. For example, a pattern in the IC design layout 200 can be dissected differently, depending on the geometry and dimensions of the corresponding pattern. In another example, a pattern may be dissected into a plurality of segments with different dimensions in one direction. In an additional example, when a pattern is asymmetric, the number of segments and the dimensions of the segments generated from the pattern by the dissection can be different between a first direction and a second direction. The various design rules and mask rules can be extracted from the semiconductor manufacturer and/or mask manufacturer in consideration of the semiconductor and mask manufacturing capability. IC design follows the design and mask rules in order to generate producible circuit patterns.

With further reference to FIG. 12, one or more targets 256 are assigned to segments of the patterns 250 and 252 after the pattern dissection. One or more target points 258 are assigned to the targets 256 of the patterns 250 and 252. In the present embodiment pattern 250 includes an edge target point 258 assigned directly on an target 256 and further includes a corner target point 258 assigned to a corner target 256 a distance D5 away. The pattern 252 includes a corner target point 258 assigned to a corner target 256 a distance D6 away.

The edge and corner target points 258 of patterns 250 and 256 will be dynamically reassigned (or moved) during the IC design process, depending on simulation outcome from OPC, as will be further described below. It is understood that for simplification only certain exemplary targets 256 and target points 258 are illustrated and that the other segments of the patterns 250 and 252 may include additional targets and target points, depending on design requirements. The targets and target points represent spatial locations relative to the patterns. For example, the targets 256 and target points 258 are spatially defined in the patterns 250 and 252 of the IC design layout 200. The various targets and target points are assigned to the patterns for simulation verification or other design purposes as discussed below.

Figure 13:
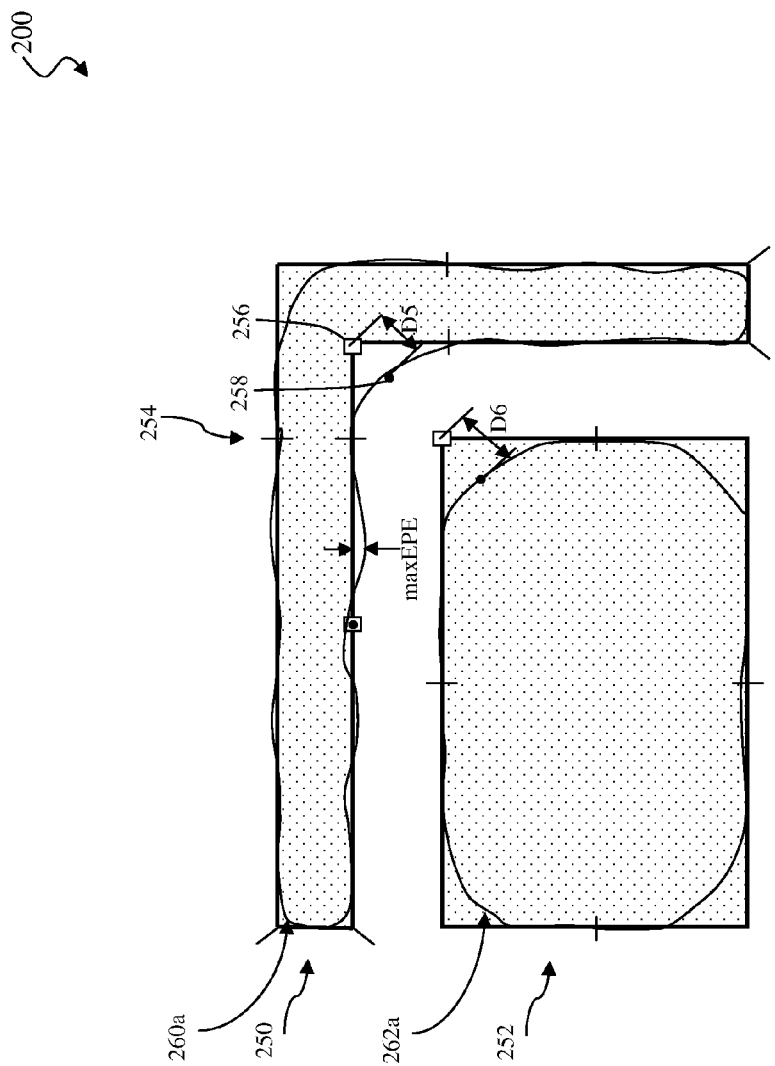

Referring to FIG. 13, optical proximity correction (OPC) simulation is performed to generate contours 260a and 262a of the corresponding patterns 250 and 252. When simulated contours 260a and 262a of the corresponding patterns 250 and 252 are generated during optical proximity correction (OPC), the defined target points 258 of the corresponding patterns 250 and 252 are checked to verify if the target points 258 are within or overlapped with the simulated contour 260a and 262a of the corresponding pattern 250 and 252. As illustrated, the contour 260a of pattern 250 includes ripples on an edge segment where a maximum edge placement error (max-EPE) is present. In this context, EPE is the distance (or error) between the edge of the pattern 250 and the contour 260. Further, both contours 260 and 262 of the corresponding patterns 250 and 252 include corner rounding/EPE.

After performing OPC, a mask rule check (MRC) to the IC design layout 200 is performed. During MRC, the IC design layout 200 is checked by one or more mask rules and is modified accordingly. In one embodiment, various mask rules are extracted from the mask fabrication. Various mask making data are collected from the mask fabrication and extracted into a set of rules that the IC design layout, as the pattern to be imaged to a mask, should follow. In one embodiment, the MRC is implemented to the IC design layout 200 through the various sections of the patterns. The sections that fail one or more mask rules are modified according to the corresponding mask rules. In the illustrated embodiment of FIG. 13, the MRC modification is not necessary as the IC design layout satisfies the MRC rule.

After performing MRC, the corner and edge target points are reassigned, OPC is repeated, and MRC is repeated to the IC design layout for a predetermined number of iterations or until the target points converge and OPC and MRC are fulfilled. The target points may converge, for example, when the target points reach their respective target, when the edge placement error (EPE) for a specific segment has reached a threshold, or when it is determined that moving the target points will not have a positive effect on the contour of the respective pattern. For example, moving a corner target point will not have a positive effect on the contour, if after moving the corner target point toward a target positioned in a corner, EPE fails to decrease or even increases.

Reassigning of the corner target points may include a rule based approach or a model based approach designed to minimize corner rounding concerns or corner EPE. The rule based approach for reassigning corner target points may provide for a fixed step size for each reassigning iteration. In the rule based approach, for example, the number of reassigning iterations (e.g., N) and the initial distance (e.g., D) from the target point to the target is initially defined. After defining the initial distance D and the number of reassigning iterations N, the fixed step size for each reassigning iteration is defined by D/N. The model based approach for reassigning corner target points may provide for a variable step size for each reassigning iteration. In the model based approach, for example, the number of reassigning iterations (e.g., N) is defined. The edge placement error ($EPE_i$) is determined for the current iteration by measuring the distance from a contour edge to the target of the pattern. The variable step size for the current reassigning iteration is defined by $EPE_i*(N-i)/N$, where i is the current iteration, $EPE_i$ is the edge placement error of the current iteration, and N is the defined number of iterations.

Reassigning of the edge target point and target may include a rule based approach or a model based approach to minimize ripple concerns or minimize the maxEPE of a segment. The rule based approach for reassigning edge target point and target may provide for a variable step that alters from one side of the edge segment to the opposing side of the edge segment in an ever decreasing step size. The rule based approach, for example, may include repeatedly reassigning the edge target point and target from to one end of a segment on an even iteration and reassigning the edge target point and target to another end of the segment on an odd iteration, in an ever decreasing step size, to determine where to ultimately place the edge target point and target to thereby reduce maxEPE for that segment. The model based approach for reassigning the edge target point and target may provide for a variable step that is a function of the location of the $maxEPE_i$ of the current iteration. The model based approach, for example, reassigns the edge target point and target to the location on the edge segment where the $maxEPE_i$ of the current iteration is located to thereby reducing maxEPE for that segment.

Figure 14:
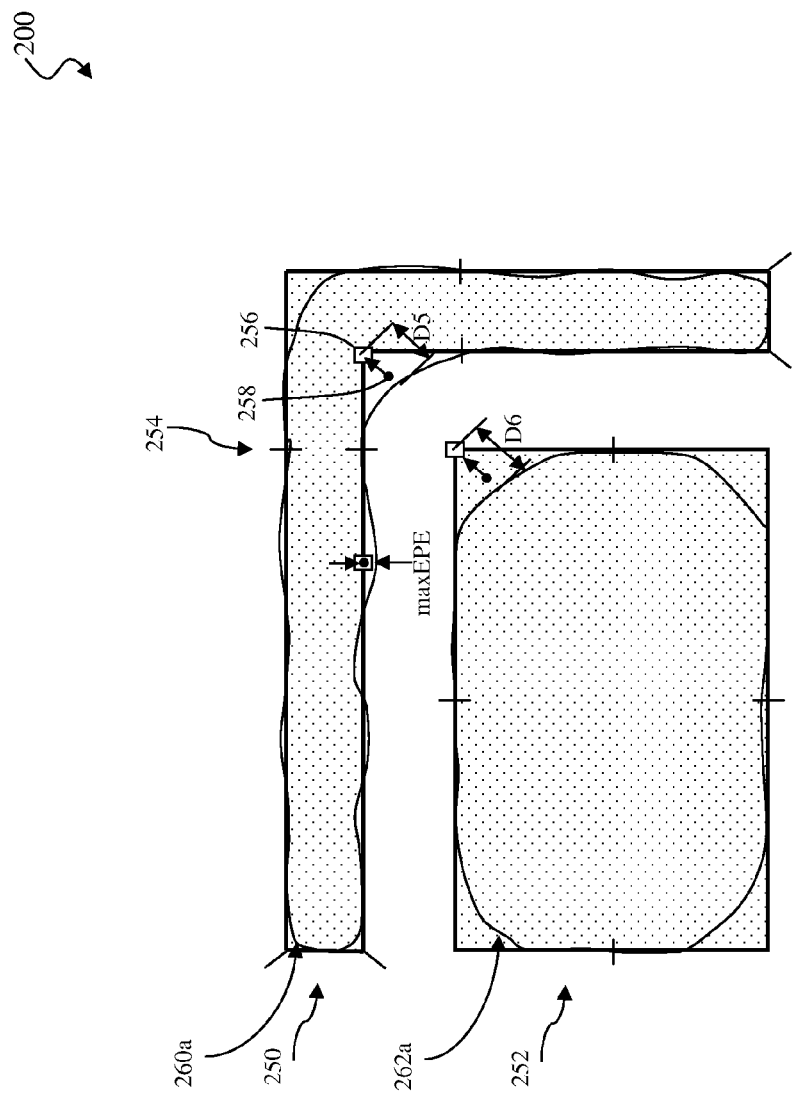

Referring to FIG. 14, the present embodiment will proceed with a rule based approach for reassigning the corner target points and with a model based approach for reassigning the edge target point to illustrate various aspects of the present disclosure. With reference to pattern 250, applying the rule based approach to reassigning of the corner target point 258 results in a fixed step size for each iteration of D5/N; and assuming that N has been defined as 3, the fixed step size is D5/3. As illustrated, the corner target point 258 of pattern 250 has moved toward target 256 (illustrated by an arrow) by a fixed step size of D5/3. With further reference to pattern 250, applying the model based approach to reassigning of the edge target point 258 and target 256 results in a variable step size for each iteration that is dependent on the location of max-EPE. As illustrated, the edge target point 258 and target 256 have moved on the segment of the pattern 250 to the maxEPE location. Similarly, in the rule based approach, the corner target point 258 of the pattern 252 is moved toward its respective target 256 (illustrated by an arrow) at a fixed step size defined by D6/3.

Figure 15:
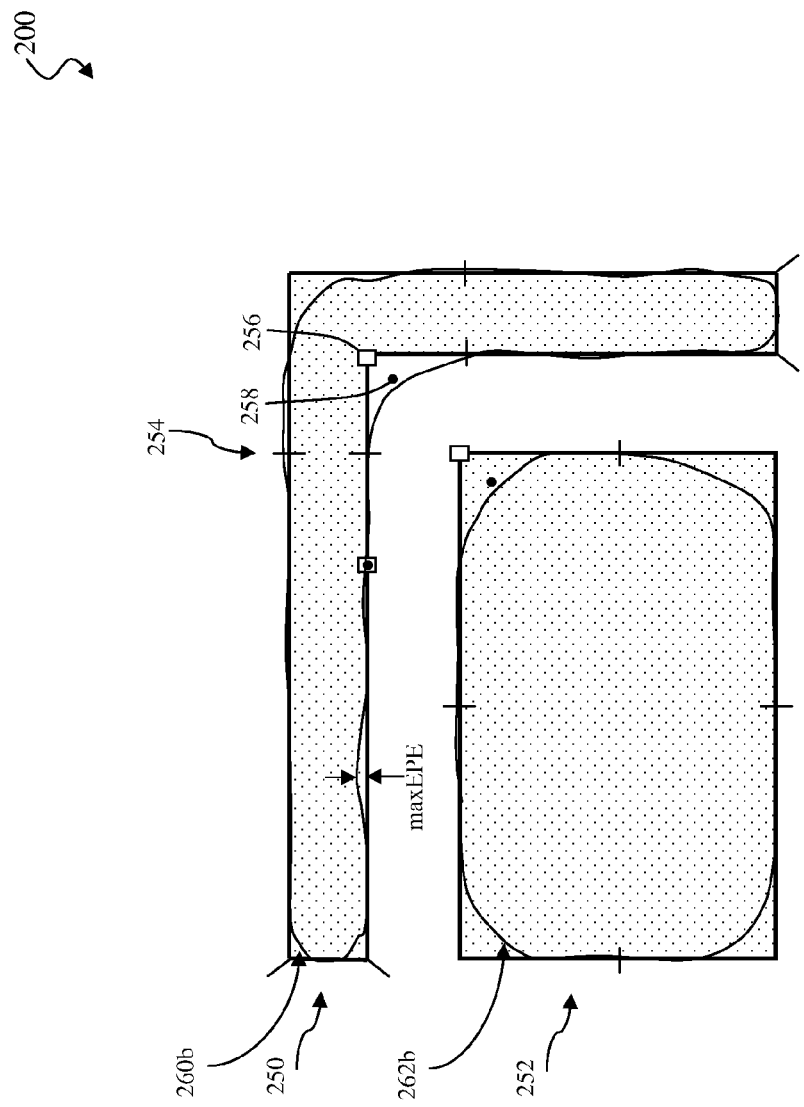

Referring to FIG. 15, after reassignment of the target points 258 of patterns 250 and 252, OPC simulation is performed to provide an updated contour 260b and 262b, for each of the patterns 250 and 252. For various reasons, the OPC simulation that generates the updated contours 260b and 262b, may not generate contours that land directly on the target points of the respective patterns. For example, OPC simulation may not generate contours that land directly on the target points because the simulation accounts for the capability of the system to form straight lines or square corners. As such, even if the target point was placed directly on a target in a corner, the simulated contour would still have corner rounding concerns. After performing OPC, the IC design layout 200 is checked for violation of MRC rules.

Figure 16:
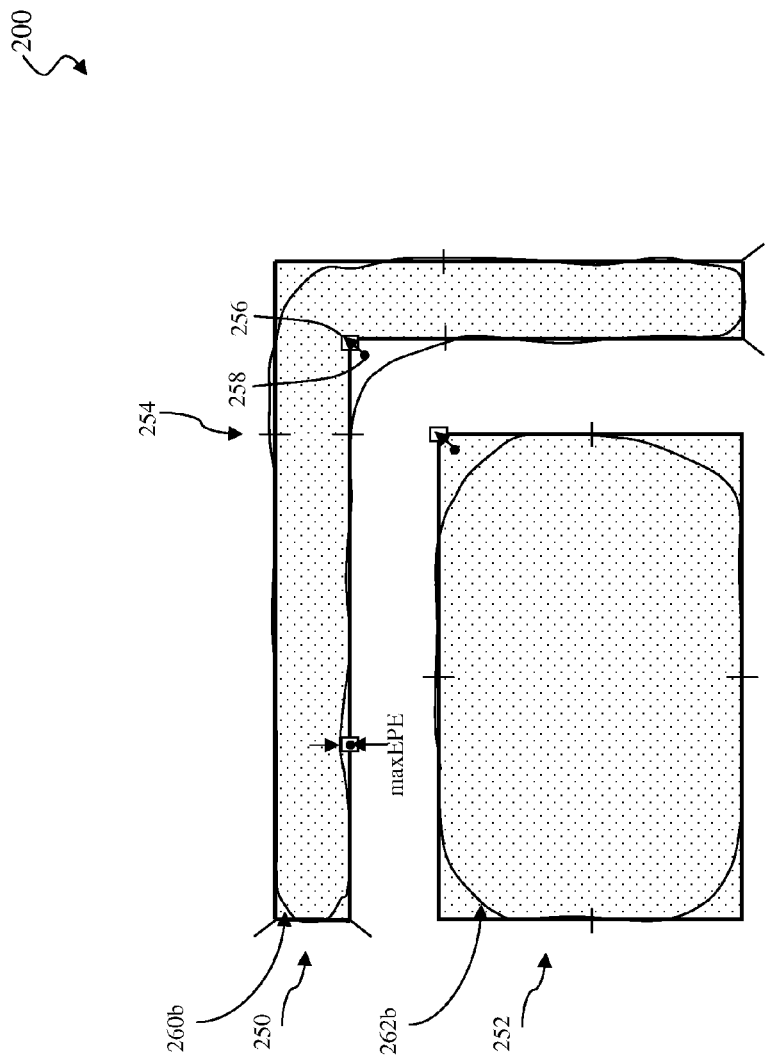

Referring to FIG. 16, after completing the first reassignment iteration by dynamically reassigning the target points, performing OPC, and MRC, the steps are repeated to the IC design layout in a second reassignment iteration. During the second reassignment iteration, the rule based approach is utilized to move the corner target points 258 at a fixed step size of D5/3 and D6/3 toward the respective target 256 (illustrated by arrows) of the patterns 250 and 252. Also, during the second reassignment iteration, the model based approach is utilized to move the edge target point 258 and target 256 to the new location of the maxEPE.

Figure 17:
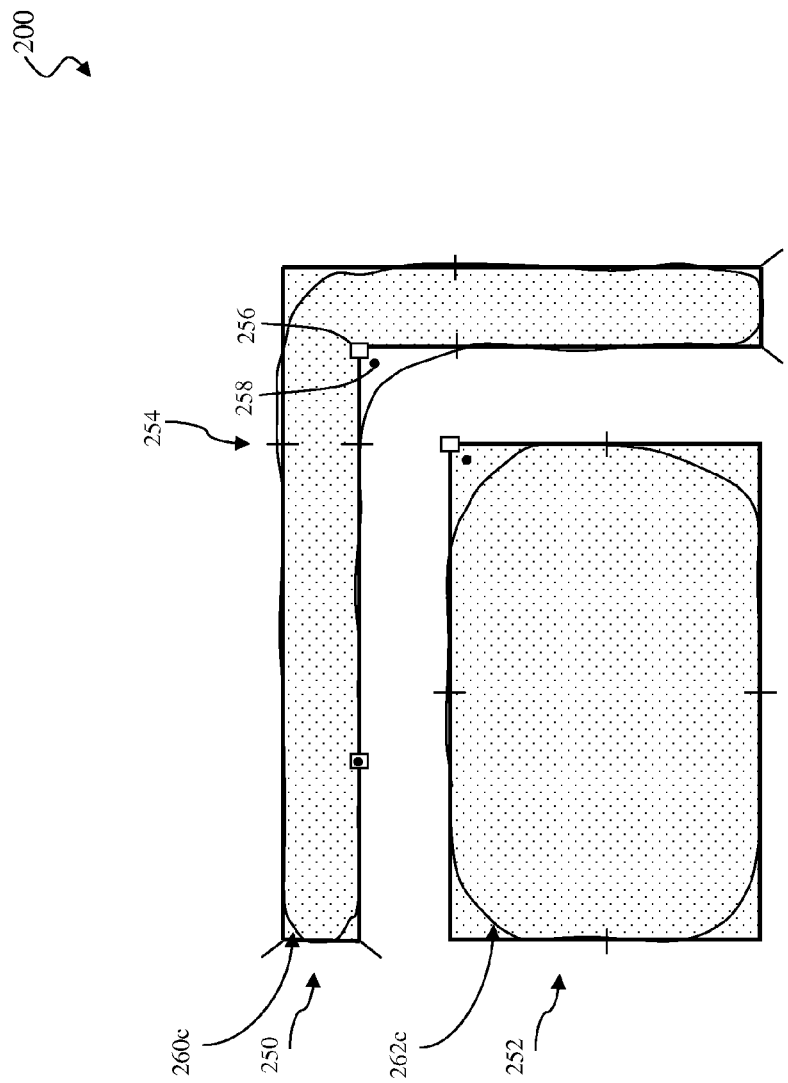

Referring to FIG. 17, after the second reassignment iteration which dynamically reassigns the corner and edge target points 254 of patterns 250 and 252, OPC simulation is performed to provide an updated contour 260c and 262c, for each of the patterns 250 and 252. After performing OPC, the IC design layout 200 is checked for violation of MRC rules.

Still referring to FIG. 17, after completing the second reassignment iteration by dynamically reassigning the target points, performing OPC, and MRC, a third reassignment iteration is performed. During the third reassignment iteration, it is recognized that the maxEPE for the edge section is within a predefined threshold and that moving the corner target points 258 toward the target 256 of the corresponding patterns 250 and 252 in the prior reassignment iteration has not further minimized corner rounding or EPE. As such, in the present embodiment, no further reassignment of the target points 258 is performed. In alternative embodiments, the corner target points 258 may be backtracked by a fraction of the prior step size to further reduce corner rounding or EPE in the corner segments of the corresponding patterns 250 and 252. It is understood that the fraction may be any appropriate fraction based on design requirements. After the third reassignment iteration, OPC is performed, and MRC is thereafter performed.

Accordingly, the rule and model based approaches to dynamic reassignment of edge and corner target points allow for fine tuning contours within the IC design layout 200 such that corner rounding is minimized on corner segments of patterns and such that ripples are minimized on edge segments of patterns. It is understood that reassignment of target points can be performed by any number of iterations and that the more iterations the better tuned the patterns of the modified IC design layout 200 will be.

If the IC design layout 200 passes the OPC evaluation after the MRC, a modified IC design layout 200 may be provided in a format accessible by a mask making tool, such as an e-beam mask writer. In one embodiment, the modified IC design layout 200 is expressed in a gds format. The modified IC design layout 200 includes various modifications from the OPC and the MRC.

After providing the modified IC design layout 200, a tape-out of the modified IC design may be prepared. The tape-out is used for fabrication of a mask or a group of masks. In one embodiment, an e-beam or a mechanism of multiple e-beams is used to form a pattern on a mask (photomask or reticle) based on the tape-out derived from the modified IC design layout 200. The mask can be formed in various technologies. In one embodiment, the mask is formed using the binary technology. In this case, the mask pattern includes opaque regions and transparent regions. The radiation beam (e.g. ultraviolet or UV beam), used to expose the image sensitive material layer (such as photoresist) coated on a wafer, is blocked by the opaque region and transmits through the transparent regions. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the PSM can be an attenuated PSM or an alternating PSM known in the art.

Other processing steps may follow after the formation of the mask. In this embodiment, a semiconductor wafer is fabricated using a mask or a set of masks formed by the above method. The semiconductor wafer includes a silicon substrate or other proper substrate and material layers formed thereon. Other proper substrate may alternatively be made of some suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor wafer may further include various doped regions, dielectric features, and multilevel interconnects (or are formed at subsequent manufacturing steps). In one example, the mask is used in an ion implantation process to form various doped regions in the semiconductor wafer. In another example, the mask is used in an etching process to form various etching regions in the semiconductor wafer. In another example, the mask is used in a deposition process, such as chemical vapor deposition (CVD) or physical vapor deposition (PVD), to form a thin film in various regions on the semiconductor wafer. Various manufacturing data may be collected from various manufacturing processes including CVD, PVD, etching, ion implantation and a lithography process from the previously processed semiconductor wafers, processing tools, and metrology tools.

Thus, the present disclosure provides an exemplary integrated circuit (IC) method. The exemplary method includes receiving an IC design layout having a pattern, assigning target points to segments of the pattern, and producing first a simulated contour of the pattern based on the assigned target points. The method further includes reassigning the target points to the segments of the pattern based on the first simulated contour of the pattern; producing a second simulated contour of the pattern based on the reassigned target points, and after producing the second simulated contour of the pattern, producing a modified IC design layout.

In some embodiments, the method further includes producing a tape-out based on the modified IC design layout. In various embodiments, the method further includes fabricating a mask according to the modified IC design layout. In certain embodiments, the method further includes applying pattern dissection to the pattern of the IC design layout to produce the segments of the pattern; and applying mask rule check (MRC) to modify the first simulated contour according to a mask rule.

In some embodiments, producing the first simulated contour includes applying an optical proximity correction (OPC) to the IC design layout. In various embodiments, reassigning the target points to the segments of the pattern includes moving at least one target point of the target points along an edge of a segment of the segments to a location that includes a maximum edge placement error. In further embodiments, reassigning the target points to the segments of the pattern includes moving at least one target point of the target points toward a corner portion of the pattern. In still further embodiments, reassigning the target points to the segments of the pattern includes moving at least one target point of the target points from an inner portion of the pattern toward an outer portion of the pattern.

The present disclosure also provides another embodiment of an integrated circuit (IC) method. The method includes receiving an IC design layout including a plurality of IC patterns and assigning targets to the IC patterns. The method further includes assigning target points associated with the targets of the IC patterns, wherein assigning the target points includes assigning a first target point of the target points at a first distance from an associated first target of the targets and assigning a second target point of the target points on an associated second target of the targets, wherein the second target is disposed at a first location on an edge of a segment of a pattern of the IC patterns. The method further includes performing an optical proximity correction (OPC) to the IC patterns using the assigned target points thereby generating a contour. The method further includes reassigning the first target point based on the generated contour, wherein reassigning the first target point includes reassigning the first target point at a second distance from the associated first target, and wherein the second distance is less than the first distance. The method further includes after reassigning the first target point, producing a modified IC design layout.

In some embodiments, The method further includes performing another OPC to the IC patterns using the reassigned target points thereby generating another contour; and reassigning the first target point based on the another generated contour, wherein reassigning the first target point based on the another generated contour includes reassigning the first target point at a third distance from the associated first target, and wherein the third distance is less than the second distance. In various embodiments, the method further includes reassigning the second target point based on the generated contour, wherein reassigning the second target point based on the generated contour includes reassigning the second target point and the associated second target to a second location on the edge of the segment of the pattern that includes a maximum edge placement error (EPE) for that segment. In certain embodiments, the method further includes performing another OPC to the IC patterns using the reassigned target points thereby generating another contour; and reassigning the second target point based on the another generated contour, wherein reassigning the second target point based on the another generated contour includes reassigning the second target point and the associated second target to a third location on the edge of the segment of the pattern that includes another maximum EPE for that segment. In some embodiments, the method further includes fabricating a mask according to the modified IC design layout.

In some embodiments, the plurality of IC patterns includes a first polygon pattern including a first width and a second polygon pattern including a second width less than the first width, the first polygon pattern includes the first target on a segment that faces the second polygon pattern, the second polygon pattern includes the second target on a segment that faces the first polygon pattern, and the second target point and the second target are fixed.

The present disclosure provides yet another embodiment of an integrated circuit (IC) method. The method includes receiving an IC design layout having a pattern and assigning target points to the pattern. The method further includes generating a contour of the pattern based on the assigned target points. The method further includes reassigning the target points of the pattern based on the generated contour, wherein reassigning the target points includes reassigning a corner target point of the target points and reassigning an edge target point of the target points. The method further includes generating another contour of the pattern based on the reassigned target points. The method further includes after generating another contour of the pattern, generating a modified IC design layout.

In some embodiments, the method further includes making a mask according to the modified IC design layout.

In some embodiments, reassigning the target points includes: using the generated contour to determine an edge placement error (EPE); and applying a model that is based on the EPE to determine a variable step size to reassign the target points. In various embodiments, the variable step size is a function of a maximum EPE along an edge segment of the pattern, and reassigning the target points includes moving the edge target point along the edge segment of the pattern by the variable step size. In certain embodiments, assigning the target points to the pattern includes assigning the corner target point at an initial distance from a corner of the pattern, and reassigning the target points includes moving the corner target point toward the corner of the pattern at a fixed step size. In further embodiments, the fixed step size is a function of the initial distance and a predetermined number of reassigning iterations to be performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) method comprising:
providing, to a computer, an IC design layout including a pattern, the pattern including a first feature and a second feature;
determining that the first feature has a first characteristic and that the second feature has a second characteristic;
assigning, based on the determination, a first target point within the first feature and at a first distance away from a segment of the first feature and a second target point directly on a segment of the second feature;
producing based on the assigned first and second target points, a first simulated contour of the pattern;
reassigning, based on the first simulated contour of the pattern, the first target point at a second distance away from the segment of the first feature and the second target point directly on the segment of the second feature;
producing, based on the first and second reassigned target points, a second simulated contour of the pattern; and
after producing the second simulated contour of the pattern, producing a modified IC design layout.

2. The IC method of claim 1, further comprising:
producing a tape-out based on the modified IC design layout.

3. The IC method of claim 1, further comprising:
fabricating a mask according to the modified IC design layout.

4. The IC method of claim 1, further comprising:
applying pattern dissection to the pattern of the IC design layout to produce the segment of the first feature and the segment of the second feature; and
applying mask rule check (MRC) to modify the first simulated contour according to a mask rule.

5. The IC method of claim 1, wherein producing the first simulated contour includes applying an optical proximity correction (OPC) to the IC design layout.

6. The IC method of claim 1, wherein reassigning the second target point to the segment of the second feature includes moving the second target point along an edge of the segment to a location that includes a maximum edge placement error.

7. The IC method of claim 1, wherein reassigning the first target point includes moving the first target point within the first feature toward a corner portion.

8. The IC method of claim 1, wherein reassigning the first target point includes moving the first target point within the first feature toward an edge portion.

9. The IC method of claim 1, wherein the determining includes assessing an edge placement error (EPE) tolerance of the first feature and assessing an EPE tolerance of the second feature.

10. An integrated circuit (IC) method comprising:
receiving, by a computer, an IC design layout including a plurality of IC patterns;
assigning targets to the IC patterns;
assigning target points associated with the targets of the IC patterns, wherein assigning the target points includes assigning a first target point of the target points at a first distance from an associated first target of the targets and assigning a second target point of the target points on an associated second target of the targets, wherein the second target is disposed at a first location on an edge of a segment of a pattern of the IC patterns;
performing an optical proximity correction (OPC) to the IC patterns using the assigned target points thereby generating a contour;
reassigning the first target point based on the generated contour, wherein reassigning the first target point includes reassigning the first target point at a second distance from the associated first target, and wherein the second distance is less than the first distance;
reassigning the second target point based on the generated contour, wherein reassigning the second target point based on the generated contour includes reassigning the second target point and the associated second target to a second location on the edge of the segment of the pattern that includes a maximum edge placement error (EPE) for that segment;
performing another OPC to the IC patterns using the reassigned target points thereby generating another contour; and
reassigning the second target point based on the another generated contour, wherein reassigning the second target point based on the another generated contour includes reassigning the second target point and the associated second target to a third location on the edge of the segment of the pattern that includes another maximum EPE for that segment; and
producing a modified IC design layout.

11. The IC method of claim 10, further comprising:
reassigning the first target point based on the another generated contour, wherein reassigning the first target point based on the another generated contour includes reassigning the first target point at a third distance from the associated first target, and wherein the third distance is less than the second distance.

12. The IC method of claim 10, further comprising fabricating a mask according to the modified IC design layout.

13. The IC method of claim 10, wherein the plurality of IC patterns includes a first polygon pattern including a first width and a second polygon pattern including a second width less than the first width,
wherein the first polygon pattern includes the first target on a segment that faces the second polygon pattern,
wherein the second polygon pattern includes the second target on a segment that faces the first polygon pattern, and
wherein the second target point and the second target are fixed.

14. An integrated circuit (IC) method comprising:
receiving, by a computer, an IC design layout having a pattern, the pattern including a first feature and a second feature;

assigning a first target on an edge of the first feature and assigning a second target on an edge of the second feature;

assigning a first target point at a distance away from the first target and assigning a second target point directly on the second target;

generating a contour of the pattern based on the assigned first and second target points;

reassigning the first and second target points based on the generated contour, wherein reassigning the first target point includes moving the first target point toward the first target of the first feature and reassigning the second target point includes moving the second target and the second target point along the edge of the second feature;

generating another contour of the pattern based on the reassigned target points; and after generating another contour of the pattern, generating a modified IC design layout.

15. The IC method of claim 14, further comprising making a mask according to the modified IC design layout.

16. The IC method of claim 14, wherein reassigning the second target point includes:

using the generated contour to determine an edge placement error (EPE); and applying a model that is based on the EPE to determine a variable step size to reassign the second target point.

17. The IC method of claim 16, wherein the variable step size is a function of a maximum EPE along an edge segment of the second feature, and wherein reassigning the second target point includes moving the second target point along the edge segment of the second feature by the variable step size.

18. The IC method of claim 14, wherein assigning the first target point includes assigning the first target point at an initial distance from a corner of the first feature, and wherein reassigning the first target point includes moving the first target point toward the corner of the first feature at a fixed step size.

19. The IC method of claim 18, wherein the fixed step size is a function of the initial distance and a predetermined number of reassigning iterations to be performed.

* * * * *